US011498207B2

(12) United States Patent
Silva (10) Patent No.: US 11,498,207 B2
(45) Date of Patent: Nov. 15, 2022

(54) TEST HEAD MANIPULATOR CONFIGURED TO ADDRESS UNCONTROLLED TEST HEAD ROTATION

(71) Applicant: Teradyne, Inc., North Reading, MA (US)

(72) Inventor: Isaac N. Silva, North Reading, MA (US)

(73) Assignee: Teradyne, Inc., North Reading, MA (US)

( * ) Notice: Subject to any disclaimer, the term of this patent is extended or adjusted under 35 U.S.C. 154(b) by 53 days.

(21) Appl. No.: 17/144,937

(22) Filed: Jan. 8, 2021

(65) Prior Publication Data

US 2022/0219315 A1 Jul. 14, 2022

(51) Int. Cl.
| | |
|---|---|
| G01R 1/04 | (2006.01) |
| G01R 1/06 | (2006.01) |
| G01R 1/067 | (2006.01) |
| G01R 1/073 | (2006.01) |
| G01R 31/28 | (2006.01) |
| G01R 31/00 | (2006.01) |
| B25J 9/04 | (2006.01) |
| G01N 29/265 | (2006.01) |

(52) U.S. Cl.
CPC ............ B25J 9/041 (2013.01); G01N 29/265 (2013.01); G01R 31/2887 (2013.01)

(58) Field of Classification Search
CPC . G01R 1/04; G01R 1/06; G01R 1/067; G01R 1/073; G01R 31/00; G01R 31/02; G01R 31/28; G01R 31/2887
See application file for complete search history.

(56) References Cited

U.S. PATENT DOCUMENTS

| | | | |
|---|---|---|---|
| 5,528,158 | A | 6/1996 | Sinsheimer et al. |
| 5,606,262 | A | 2/1997 | Montalbano et al. |
| 6,259,265 | B1 | 7/2001 | Han et al. |
| 6,766,996 | B1 | 7/2004 | Somers |
| 6,888,343 | B1 | 5/2005 | Holt et al. |
| 7,312,604 | B2 | 12/2007 | Trudeau et al. |

(Continued)

FOREIGN PATENT DOCUMENTS

| | | |
|---|---|---|
| EP | 0979415 B1 | 7/2004 |
| JP | 2000199776 A | 7/2000 |

(Continued)

OTHER PUBLICATIONS

International Search Report and Written Opinion of the International Searching Authority dated Apr. 19, 2022, International Application No. PCT/US2022/011123 filed Jan. 4, 2022, 10 pages.

*Primary Examiner* — Neel D Shah
(74) *Attorney, Agent, or Firm* — Burns & Levinson LLP (57) ABSTRACT

An example test head manipulator includes a tower having a base and a track, where the track is vertical relative to the base, and arms to enable support for the test head. The arms are connected to the track to move the test head vertically relative to the tower, and the arms are configured to control rotation of the test head. Each of the arms includes a cam that is rotatable, and at least one plunger in contact with the cam and that is configured to contact the test head. Rotation of the cam is controllable to move the at least one plunger to offset an uncontrolled rotation the test head.

22 Claims, 9 Drawing Sheets

(56) References Cited

U.S. PATENT DOCUMENTS

| | | | |
|---|---|---|---|
| 7,383,746 B2 | 6/2008 | Heigl | |
| 7,528,620 B2 | 5/2009 | Mochizuki et al. | |
| 7,728,579 B2 | 6/2010 | Mueller | |
| 8,212,578 B1 | 7/2012 | Gajda et al. | |
| 8,684,168 B2 * | 4/2014 | Thiel | G01R 31/2893 |
| | | | 414/223.01 |
| 8,981,807 B2 | 3/2015 | West et al. | |
| 10,094,854 B2 * | 10/2018 | Fowler | G01R 31/2887 |
| 2004/0245982 A1 | 12/2004 | Heigl et al. | |
| 2005/0020402 A1 | 1/2005 | Ny et al. | |
| 2006/0001416 A1 | 1/2006 | West | |
| 2006/0156836 A1 | 7/2006 | Ny et al. | |
| 2006/0255820 A1 | 11/2006 | Ramamoorthi | |
| 2008/0122432 A1 | 5/2008 | Mueller | |
| 2010/0045323 A1 * | 2/2010 | Nappen | G01R 31/2887 |
| | | | 324/756.01 |
| 2011/0174098 A1 * | 7/2011 | Weissacher | G01R 31/2887 |
| | | | 74/89.23 |
| 2014/0301817 A1 | 10/2014 | Weissacher et al. | |
| 2016/0186804 A1 | 6/2016 | Sinsheimer et al. | |
| 2017/0115327 A1 | 4/2017 | Fowler et al. | |
| 2017/0248632 A1 | 8/2017 | Thompson et al. | |
| 2018/0100893 A1 | 4/2018 | Baer et al. | |

FOREIGN PATENT DOCUMENTS

| | | | |
|---|---|---|---|
| WO | 9626446 A1 | 8/1996 | |
| WO | 9849569 A1 | 11/1998 | |

\* cited by examiner

TEST HEAD MANIPULATOR CONFIGURED TO ADDRESS UNCONTROLLED TEST HEAD ROTATION

TECHNICAL FIELD

This specification relates generally to at test head manipulator configured to address uncontrolled test head rotation.

BACKGROUND

Automatic test equipment (ATE) includes a test head, which houses test electronics to perform testing on a device under test (DUT). In some ATE, multiple DUTs are connected to a device interface board (DIB). The test head mates to the DIB in order to establish electrical connections to the DUTs and, through those connections, perform various tests. A manipulator is a type of device that transports the test head within a testing facility.

SUMMARY

An example test head manipulator includes a tower having a base and a track, where the track is vertical relative to the base, and arms to enable support for the test head. The arms are connected to the track to move the test head vertically relative to the tower, and the arms are configured to control rotation of the test head. Each of the arms includes a cam that is rotatable, and at least one plunger in contact with the cam and that is configured to contact the test head. Rotation of the cam is controllable to move the at least one plunger to offset an uncontrolled rotation the test head. The example test head manipulator may include one or more of the following features, either alone or in combination.

The at least one plunger may include two plungers. The two plungers may be oriented in opposite directions relative to the test head such that each of the two plungers is configured to contact a different part of the test head. Rotation of the cam may cause longitudinal movement of the two plungers that is transferred to the test head to offset the uncontrolled rotation. Cross-sections of the cam may have radii that vary continuously along at least part of each cross-section.

The two plungers may include a first plunger on a first side of the cam. The first plunger may include a first roller that contacts the cam. The two plungers may include a second plunger on a second side of the cam. The second plunger may include a second roller that contacts the cam. The first plunger and the second plunger may be about 180° apart such that the first plunger is oriented towards a top of an arm of the test head manipulator and the second plunger is oriented towards a bottom of the arm. The cam is may be between the first plunger and the second plunger. The cam may be controllable to rotate relative to the first plunger and the second plunger so that, at different angles of rotation, different parts of the cam contact the first plunger and the second plunger.

The cam may include a first angular structure and a second angular structure that are rotatable about a same axis. The first angular structure may have a first radius that changes along part of the first angular structure, and the second angular structure may have a second radius that changes along at least part of the second angular structure. The first radius may increase in a first angular direction, and the second radius may increase in a second angular direction. The first angular direction may be opposite to the second angular direction. At a maximum radius of the first angular structure, the first angular structure may have a straight edge discontinuity connecting the maximum radius to a minimum radius of the first angular structure. At a maximum radius of the second angular structure, the second angular structure may have a straight edge discontinuity connecting the maximum radius to a minimum radius of the second angular structure. The first angular structure and the second angular structure may each be constrained to rotation that is less than 360°. The first angular structure and the second angular structure may each be constrained to rotation that is between 0° and 145°.

The at least one plunger may include a ball configured to contact a part of the test head. The ball may be rotatable at least in tumble and theta directions relative to an arm of the test head manipulator. The ball may be supported by multiple balls, where each of the multiple balls is rotatable relative to the ball, and where the ball is rotatable relative to each of the multiple balls.

The at least one plunger may include a housing to house the ball, a shaft to which the housing connects, and at least one spring that is at least partly compressible to change a longitudinal dimension of the at least one plunger. The at least one plunger may include a roller to contact the cam. The roller may be configured to transmit displacement produced by rotation of the cam to the plunger.

The test head manipulator may include a handle, at least a part of which is external to an arm of the test head manipulator. The handle may connect mechanically to the cam. The handle may be controllable to rotate the cam manually. The cam may be controllable to move the at least one plunger to offset a ±1.5° rotation the test head or less. There may be two arms and two plungers, one plunger for each of the arms. The test head manipulator may include one or more motors to drive movement of the arms along the track.

An example test head manipulator for transporting a test head includes a tower having a base and a track, where the track is vertical relative to the base, and arms to enable support for the test head. The arms are connected to the track to move the test head vertically relative to the tower. The arms are configured to control rotation of the test head. Each of the arms includes means to offset an uncontrolled rotation the test head. The example test head manipulator may include one or more of the following features, either alone or in combination.

The means to offset the uncontrolled rotation may include two plungers oriented in opposite directions, where each of the plungers is configured to contact a different part of the test head, and a cam that is rotatable. Each of the plungers may be configured to contact the cam. Rotation of the cam may cause longitudinal movement of the plungers that is transferred to the test head to offset the uncontrolled rotation. The test head manipulator may also include a handle, at least a part of which that external to an arm of the test head manipulator. The handle may connect mechanically to the cam. The handle may be controllable to rotate the cam manually.

Any two or more of the features described in this specification, including in this summary section, may be combined to form implementations not specifically described in this specification.

At least part of the systems and techniques described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the systems and techniques described in this specification may be configured or controlled using a computing system comprised of one or more processing devices and memory storing instructions that are executable by the one or more processing devices to perform various control operations. The systems and techniques, and components and variations thereof, described herein may be configured, for example through design, construction, arrangement, placement, programming, operation, activation, deactivation, and/or control.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described herein are example implementations of a test head manipulator for transporting a test head. The test head is configured to hold a printed circuit board (PCB) and to transport or to manipulate that PCB relative to a test system. For example, the manipulator may hold, transport, and manipulate a device interface board (DIB). In this regard, a DIB includes mechanical and electrical interfaces to one or more devices under test (DUTs) that are being tested or that are to be tested by a test system, such as automatic test equipment (ATE). An example manipulator includes a tower having a base and a track, where the track is vertical relative to the base, and arms to enable support for the test head. The arms are connected to the track to move the test head vertically relative to the tower. The arms are also configured to control movement, such as rotation, of the test head. Each of the arms includes a cam that is rotatable and at least one plunger in contact with the cam and that is configured to contact the test head. Rotation of the cam is controllable to move the at least one plunger to offset an uncontrolled rotation the test head.

Figure 8:
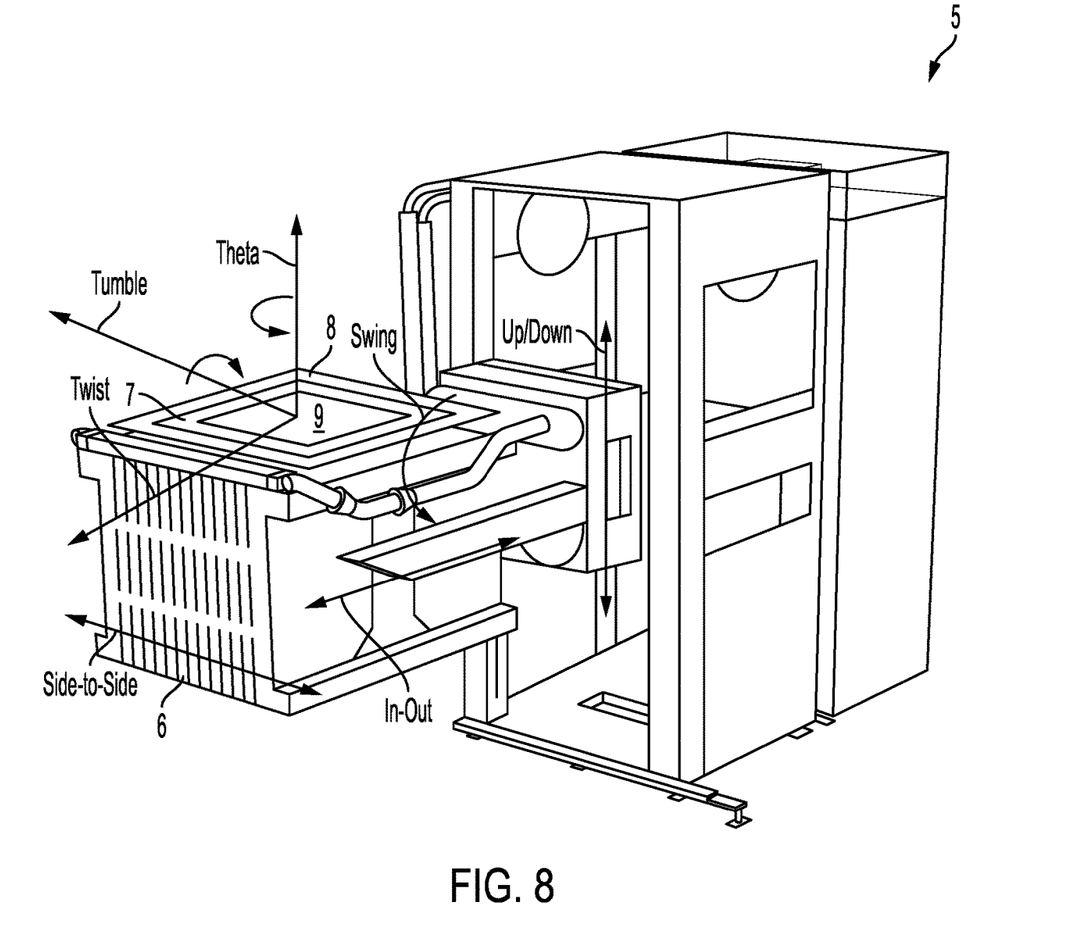
FIG. 8 is an illustration showing a perspective view of an example manipulator and the controlled motions that may be implemented thereby.

As noted, the movements or manipulations that may be performed by the manipulator include rotating the test head. Referring to FIG. 8, for example, test head manipulator 5 is configured to move the test head 6 up and down, in and out, and side to side. Manipulator 5 is also configured to implement, for test head 6, tumble rotation, theta rotation, twist rotation, and swing rotation. These movements may be controlled, for example, implemented in response to instructions or manual movements to position the test head at a desired location and orientation. For example, the test head may be rotated through 90°, 180°, 270°, or 360°.

In some cases, however, uncontrolled angular rotation of the test head may occur. For example, the weight distribution of a DIB or other structure on the test head may be uneven, for example, the DIB may have additional weight on its front edge 7 relative to its back edge 8. This additional weight may produce uncontrolled rotation of the test head. For example, in the orientation shown in FIG. 8, such uneven weight distribution may produce a small and uncontrolled tumble rotation angular displacement of the test head. In an example where the test head is rotated 90°, an uneven weight distribution may produce a small and uncontrolled theta rotation angular displacement of the test head. To address these uncontrolled rotations, the cam and plunger are configured and controllable to adjust the rotation of the test head. In an example, the cam and the plunger are configured to implement controlled rotation on the order of ±1.5° to counteract or offset the uncontrolled rotation. However, the manipulators described herein are not limited to any particular values for the angular rotation corrections enabled by the cam and the plunger. Operation of the cam and plunger may be controlled manually; however, in some implementations their operation may be computer-controlled.

Figure 1:
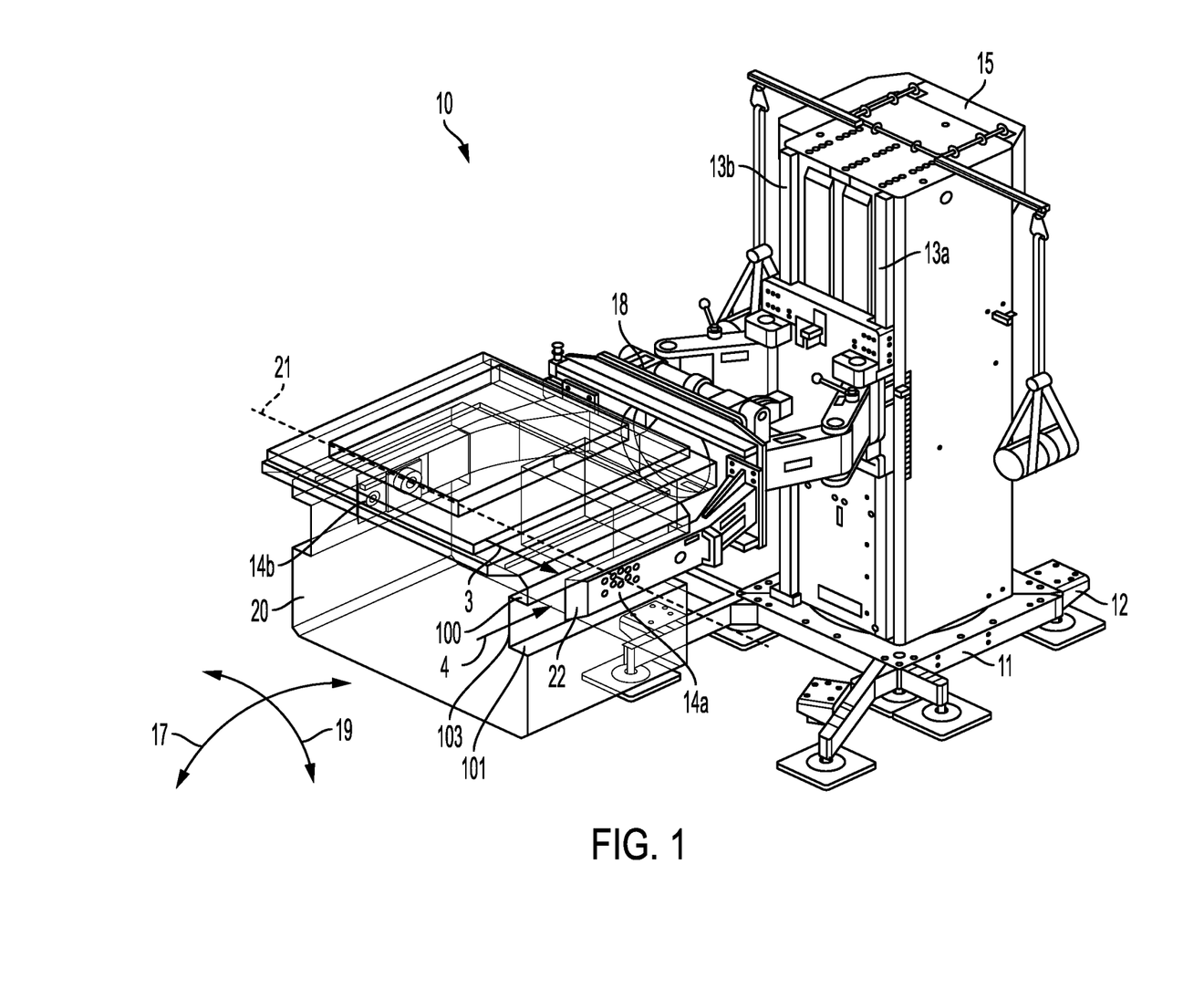
FIG. 1 is an illustration showing a partially-transparent perspective view of an example test head manipulator and test head.

FIG. 1 shows an example implementation of a test head manipulator 10 Manipulator 10 may, but need not, have the same structure and capabilities as manipulator 5 of FIG. 8. Manipulator 10 includes a tower 15, tracks 13a and 13b, and arms 14a and 14b. Tower 15 includes a base 11 and a track 12. In this example, base 11 is connected to track 12 and is configured to move along track 12.

As noted, tower 15 includes two vertical tracks 13a, 13b, one on each side of manipulator 10. Tracks 13a, 13b are arranged along a vertical length of tower 15, as shown in FIG. 1. In some implementations, tracks 13a, 13b are arranged along the tower's entire vertical length, and in some implementations tracks 13a, 13b are arranged along only part of (e.g., less than the whole of) the tower's vertical length. Arms 14a, 14b are mounted on tracks 13a, 13b via a support structure 18. In this configuration, for example, support structure 18 is connected to tracks 13a, 14b, and arms 14 are connected to the support structure. Support structure 18 is configured to move vertically along the tracks 13a, 13b, thus also causing the arms 14a, 14b to move vertically along the tower 15. Support structure 18 is also configured to implement the movements shown in FIG. 8. In this regard, one or more motors (not shown) are configured and arranged to drive movement of the support structure 18, and thus the arms 14, along the tracks 13a and 13b. In some implementations, arms 14a, 14b are configured and controllable to rotate between 0° and 180° in the directions of arrow 17. In some implementations, arms 14a, 14b are configured and controllable to rotate between 0° and 360° in the directions of arrow 17. One or more motors (not shown) are configured and arranged to control these rotations and the other rotations described with respect to FIG. 8.

Arms 14 are configured and controlled to hold test head 20. As noted, test head 20 is part of ATE and may include test electronics, such as pin electronics, test instruments or the like, for testing DUTs. In this regard, as noted, in some implementations, a DUT is connected to a DIB, which provides electrical and mechanical connections between the DUT and the test head. A DIB 9 may be held by the test head, as shown in FIG. 8. In some implementations, vertical movement driven by the motors brings test head 20 into contact with the DIB.

In some cases, unevenly-distributed weight of, or on, the DIB can produce a small uncontrolled rotation of the test head relative to arms 14a, 14b and around axis 21, for example. This uncontrolled rotation is undesired and can adversely affect movement and subsequent placement of the DIB in a test system. This uncontrolled rotation is referred to as a "rotational error". In the examples described herein, components within arms 14a, 14b of manipulator 10 are configured and arranged to correct this rotational error, at least in part. In some implementations, the components are located in a front section 22 of each arm 14a, 14b. In some implementations, the components may be located in the middle or back of the arm.

Figure 2A:
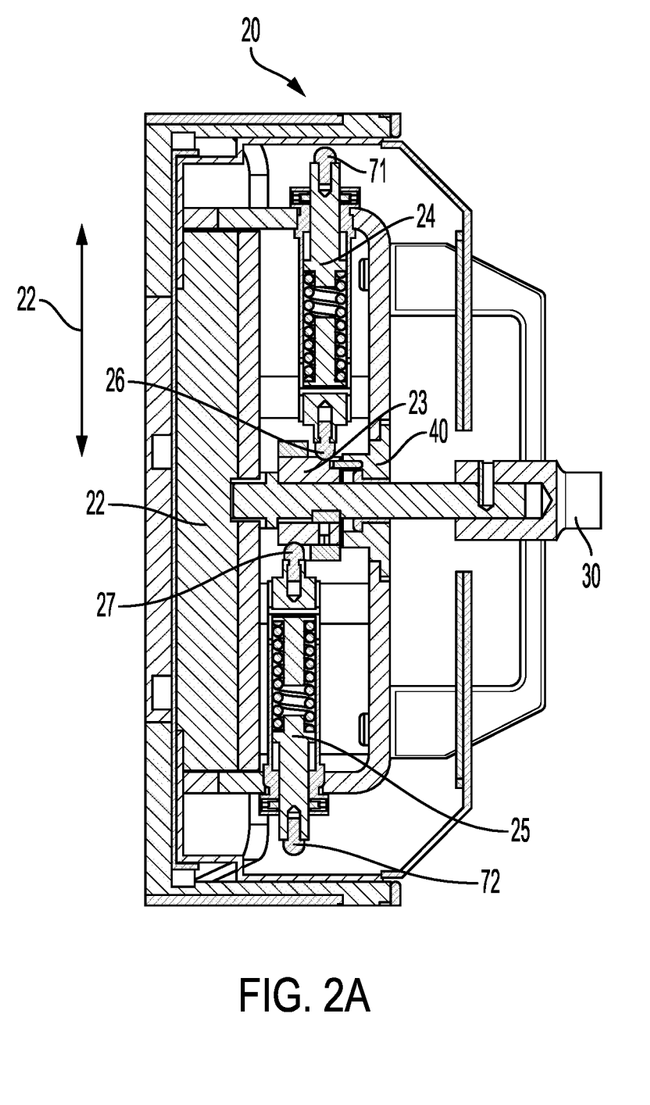
FIG. 2A is an illustration showing a cut-away, front view of part of an example arm included in the test head manipulator.
Figure 2B:
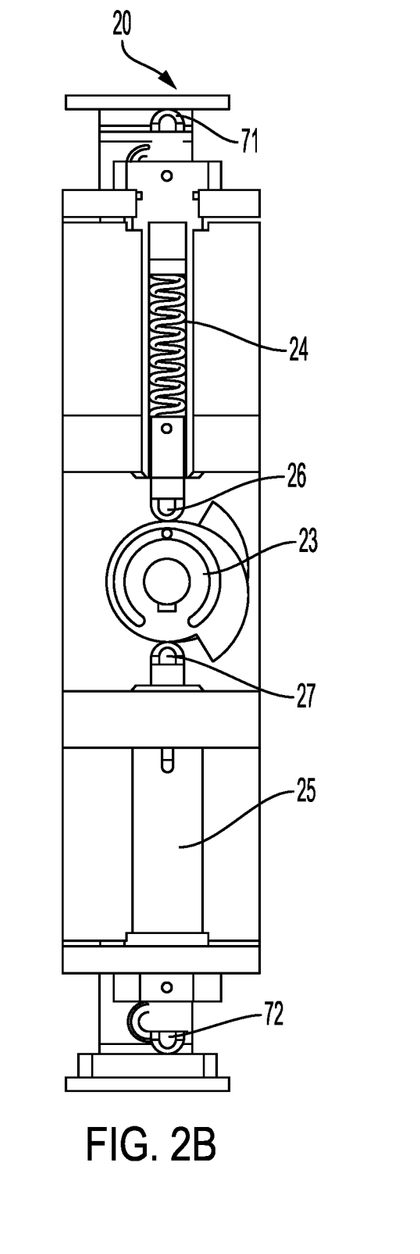
FIG. 2B is an illustration showing a cut-away, side view of a part of the arm of FIG. 2A.
Figure 3A:
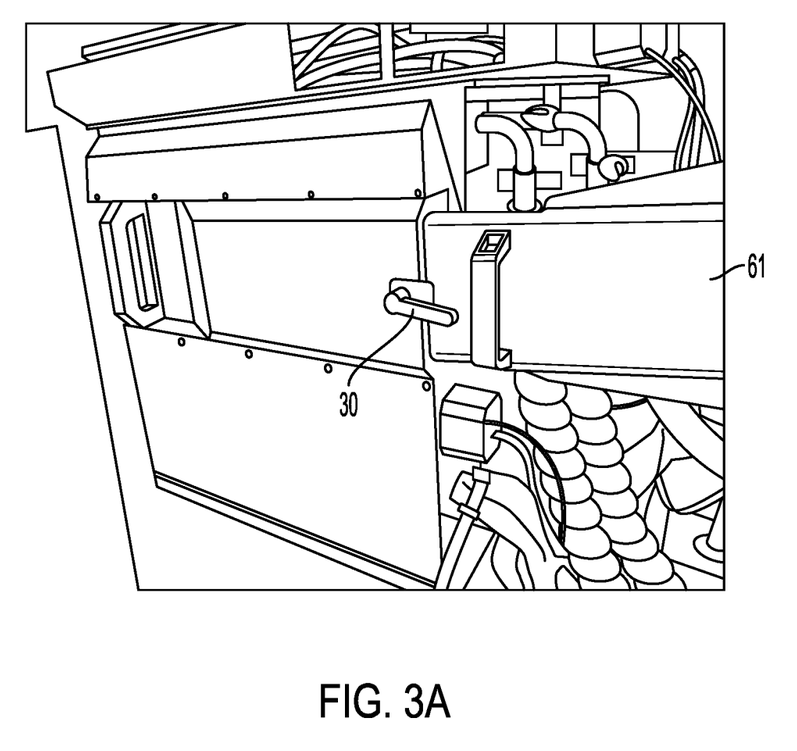
FIG. 3A is a photograph showing a perspective view of part of the arm of the test head manipulator.
Figure 3B:
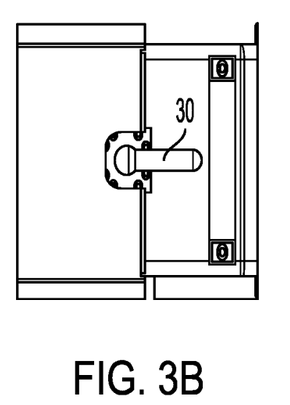
FIGS. 3B, 3C, and 3D are illustrations showing front views of a handle on the arm of FIG. 2A at various rotational positions.
Figure 3C:
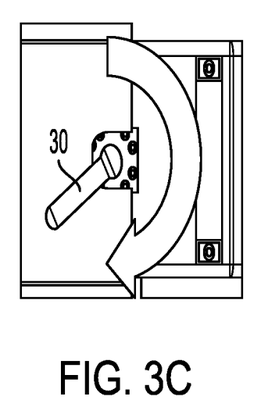
Figure 3D:
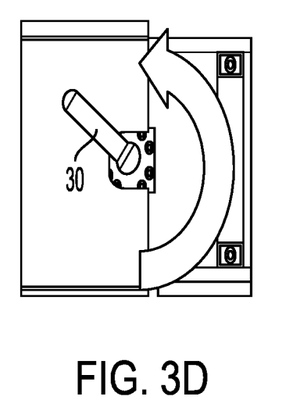

FIG. 2A shows a cut-away, front view of front section 22 of arm 14a from the direction of arrow 4 of FIG. 1. FIG. 2B shows a side view of part of front section 22 of arm 14a from the direction of arrow 3 of FIG. 1. Arm 14b may have a similar or identical construction to that shown in FIGS. 2A and 2B. Accordingly, only the construction of arm 14a described herein. Arm 14a includes a cam 23. Cam 23, in this example, is part of a cam assembly that includes a rotatable object that is configured to transfer its rotational motion to plungers 24 and 25. This causes at least part of one or both of the plungers to move linearly in the directions of arrows 2. In some implementations, each arm 14a, 14b includes a cam and two plungers in the configuration shown in FIGS. 2A and 2B. In some implementations, each arm may include a cam and a single plunger (not shown in the figures).

In this example, cam 23 is in contact with plungers 24 and 25 in a configuration in which each plunger 24, 25 is located at a different side of cam 23. For example, plunger 24 is arranged at a 180° angle relative plunger 25. As such, plungers 24 and 25 face in opposite directions and; therefore, each plunger contacts a different part of test head 20—for example, the top 100 and bottom 101 of the groove or indentation 103 in test head 20 shown in FIG. 1. For example, as shown in FIGS. 2A and 2B, plunger 24 is oriented towards a top of arm 14a and plunger 25 is oriented towards a bottom of arm 14a. "Top" and "bottom" here refer to parts of arm 14a when in the configuration shown in FIG. 1 and are not intended to be limiting. The oppositely arranged plungers are used to correct the rotational error at different orientations of the test head—for example, when it is upside down.

Figure 4:
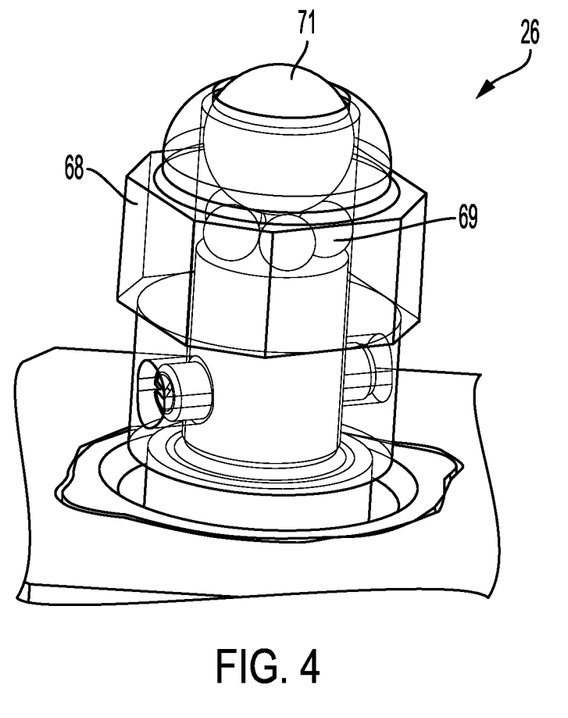
FIG. 4 is an illustration showing a perspective view of a ball assembly included in a plunger that is part of the arm of FIG. 2A.

As shown, cam 23 is between, and in direct physical contact with, plungers 24, 25 in this example. In this regard, plunger 24 includes roller 26 in contact with cam 23 and plunger 25 includes roller 27 in contact with cam 23. Plunger 24 also includes roller 71 in contact with part 100 test head 20 and plunger 25 includes roller 72 in contact with part 101 of test head 20. Each roller 26, 27 may include a ball assembly have the configuration shown in FIG. 4. As shown in FIG. 4, example roller 26 includes a ball 71 supported by—for example, in direct contact with—multiple (in this example, six) balls 69 within housing 68. Each of the multiple balls 69 is rotatable relative to ball 71, and the ball 71 is rotatable relative to each of multiple balls 68. Likewise, ball 71 is in direct contact with test head 20, but that contact is not fixed. That is, ball 71 may rotate when test head moves, allowing the plunger to correct the angular position of test head 14a as described herein. For example, the plunger may apply forced toward and to the test head via ball 71. That force may cause angular movement of the test head, during which ball 71 rotates to allow continuous angular movement of the test head.

Referring back to FIGS. 2A and 2B, cam 23 is also mechanically connected to handle 30, which is also shown in FIGS. 3A, 3B, 3C, and 3D. Through this mechanical connection, handle 30 is manually rotatable to control rotation of cam 23 and thereby control tension in the plungers and rotation of test head 20. Thus, by rotating handle 30 to various angles, shown in FIGS. 3B to 3D, cam 23 also rotates relative to the plungers so that, at different angles of rotation, different parts of cam 23 contact the plungers resulting in different longitudinal movements of plungers 24, 25. As plungers 24, 25 are in contact with test head 20, that longitudinal movement transfers to test head 20 causing angular movement of test head 20. In the implementation shown in FIGS. 3A to 3D, handle 30 is external to arm 14a.

Figure 5A:
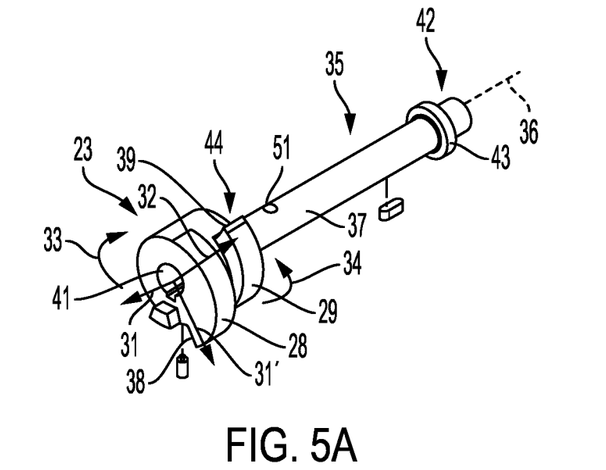
FIGS. 5A and 5B are illustrations showing perspective views of components include in an example cam assembly that is part of the arm of FIG. 2A.
Figure 5B:
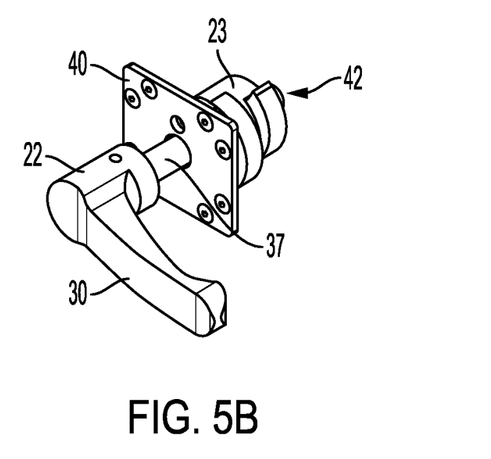
Figure 5C:
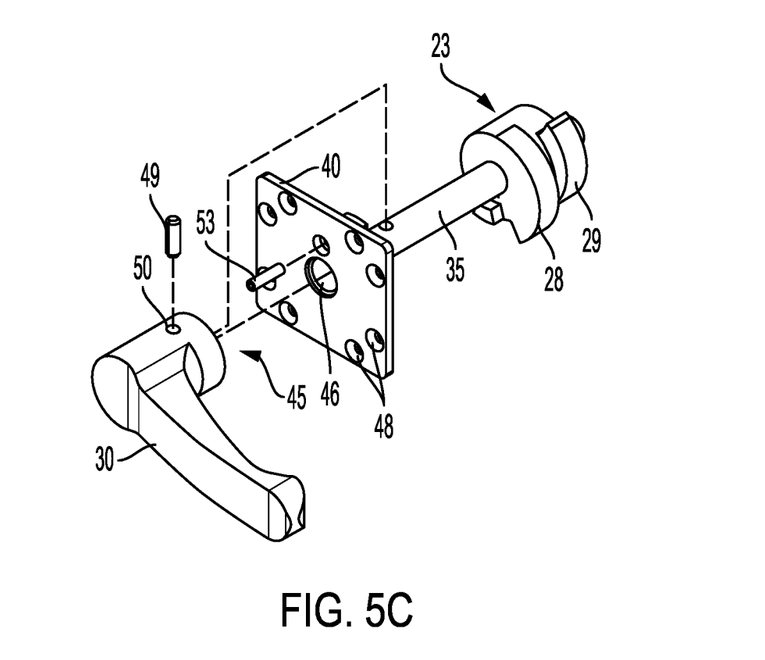
FIG. 5C is an illustration showing an exploded view of components included in the example cam assembly of FIGS. 5A and 5B.

FIG. 5A shows an example configuration of a cam assembly. FIGS. 5B and 5C show cam 23 in assembled and exploded positions, respectively, connected to handle 30. As shown, cam 23 includes an angular structure 28 having radius 31 that changes along part of angular structure 28 to reach maximum radius 31', and angular structure 29 having radius 32 that changes along part of angular structure 29 to reach maximum radius 32'. As shown in FIGS. 5A to 5C, radius 31 increases in angular direction 33 and radius 32 increase in angular direction 34. In this example, angular direction 33 is opposite to angular direction 34. Therefore, cross-sections of cam 23 have radii that vary continuously along part of each cross section.

Angular structure 28 includes a straight edge discontinuity 38 that connects maximum radius 31' to minimum radius 31. Straight edge discontinuity 38 of angular structure 28 is located at maximum radius 31'. Similarly, angular structure 29 includes a straight edge discontinuity 39 that connects maximum radius 32' to minimum radius 32. Straight edge discontinuity 39 of angular structure 29 is located at maximum radius 32'. The angular structures 28 and 29 are rotatable about a same axis 36. In some implementations, angular structure 28 and 29 can each rotate between 0° and 360°. In some implementations, angular structure 28 and 29 are each constrained to rotate between 0° and 145°. In some implementations, rotation is constrained so as not to move past each straight edge discontinuity; that is, so that a respective plunger does not drop off the discontinuity.

Cam 23 is connected to handle 30 through rod 35 and plate 40. Rod 35 includes a cylindrical structure 37 having ring 43 connected to end 42 thereof. Ring 43 is fixedly attached to rod 35 at end 42. In some implementations, ring 43 is configured to move along axis 36 on the outer surface of cylinder 37. Rod 35 passes through central tubular hole 41 through cam 23 such that end 44 of rod 35 passes through central tubular hole 41, hole 46 of plate 40, and into throughbore 45 of handle 30. Central tubular hole 41 of cam 23 is along longitudinal axis 36 and may extend from angular structure 28 through angular structure 29. In this example, plate 40 is located between cam 23 and handle 30 to connect cam 23 and handle 30 to an arm, such as arm 14a, of the manipulator. Plate 40 includes holes 48 to attach handle 30 to arm 14a using pins 53. As noted above, to secure handle 30 to arm and also to cam 23, rod 35 passes through throughbore 41 of cam 23, through hole 46 of plate 40, and into throughbore 45 of handle 30. Pin 49 passes through hole 50 of handle 30 and also hole 51 of rod 35 to secure rod 35 to handle 30.

Figure 6A:
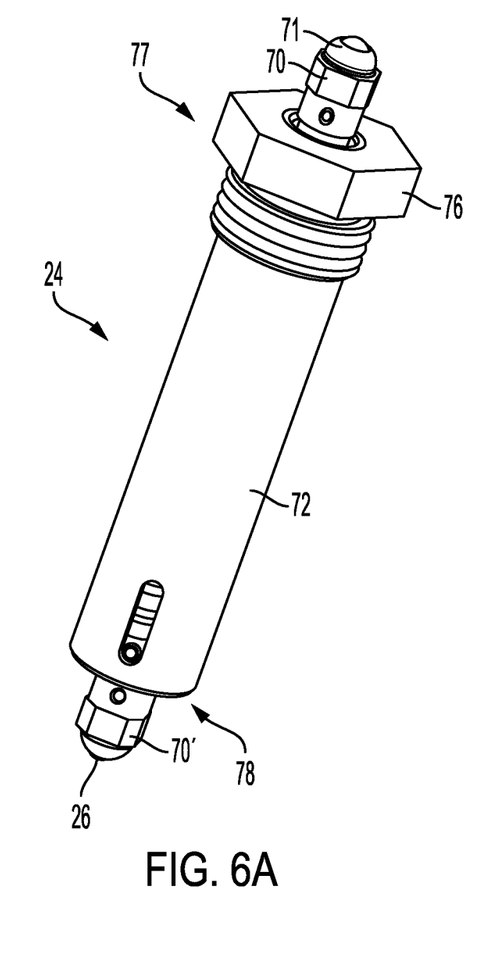
FIG. 6A is an illustration showing a perspective view of an example plunger that is part of the arm of FIG. 2A.
Figure 6B:
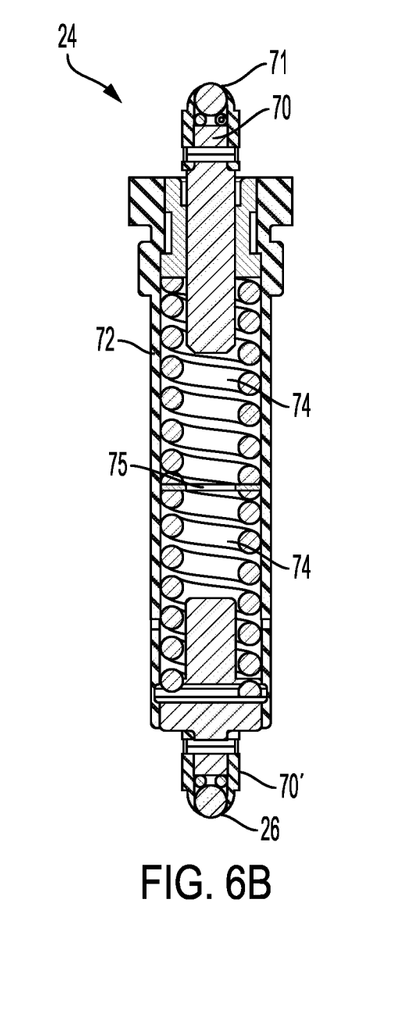
FIG. 6B is an illustration showing a cut-away, side view of the example plunger of FIG. 6A.
Figure 6C:
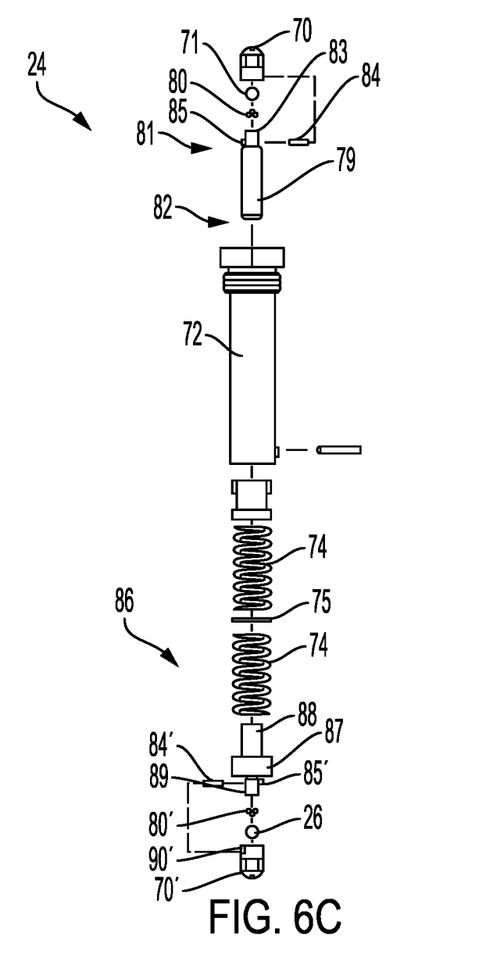
FIG. 6C is an illustration showing an exploded view of the example plunger of FIG. 6A.

FIGS. 6A to 6C show example implementations of plungers 24, 25. Each plunger 24, 25 may have the same structure and function. Accordingly, only one plunger 24 is described herein. Plunger 24 includes housing 70 to house the ball assembly described with respect to FIG. 4. Referring also to FIG. 1, ball 71 of the ball assembly is configured to rotate in multiple degrees of freedom including, but not limited to, the directions of arrows 17 and 19. Plunger 24 includes shaft 72. Shaft 72 includes a top end 77 and a bottom end 78. The top end 77 includes a shoulder 76 which is connected to housing 70 by rod 79. Rod 79 has a top end 81 and a bottom end 82. Top end 81 includes a step 83 including a hole 85. When plunger 24 is assembled, step 83 is positioned within housing 70. O-ring 80 and pin 84 pass through hole 90 of housing 70 and hole 85 to secure housing 70 to rod 79 and plunger 24. Housing 70' is connected to bottom end 78 of shaft 72 by structure 86. Structure 86 includes a rod and a ring 87 fixedly attached to the structure. The rod include a top part 88 and a bottom part 89. The top part 88 has a radius greater than bottom part 89. Ring 87 is located top of the rod and between top part 88 and bottom part 89. Bottom part 89 can be secured to housing 70' by O-ring 80' and pin 84' which is inserted to through hole 85' and 90'. When plunger 24 is assembled, ring 87 is located at end 78 of shaft 72 near cam 23 and top part 88 is located inside spring 74 along its longitudinal direction.

As shown in FIGS. 6A to 6C, shaft 72 houses multiple springs 74—in this example, two springs. Springs 74 are at least partly compressible to change a longitudinal dimension of plunger 24. Springs 74 are placed along the longitudinal axis of shaft 72. Plate 75 is located between two springs 74. In the example of FIGS. 6A to 6C, the two springs 74 are identical in structure and length. In some implementations, springs 74 are not identical. In some implementations, plunger 24 includes only one spring 74 or more than two springs.

As explained above, the tension on handle 30 transfers to cam 23. Cam 23 through its roller 26 transmits displacement which is produced by rotation of cam 23 to plunger 24. As plunger 24 is in contact with test head 20 through ball 71, the transferred displacement of plunger 24, through springs 74, can move the test head. The floating connection between ball 71 and the test head enables rotation of the test head to offset the uncontrolled/undesired rotation described previously.

Figure 7A:
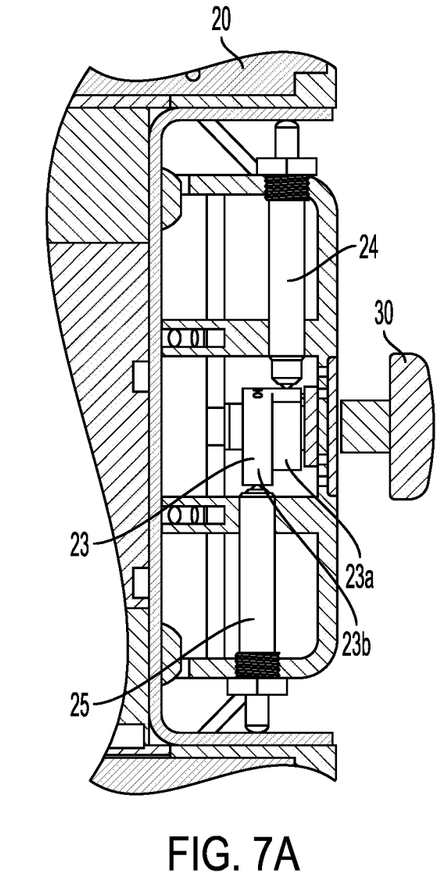
FIG. 7A is an illustration showing a cut-away, front view of part of the example arm of FIG. 2A.
Figure 7B:
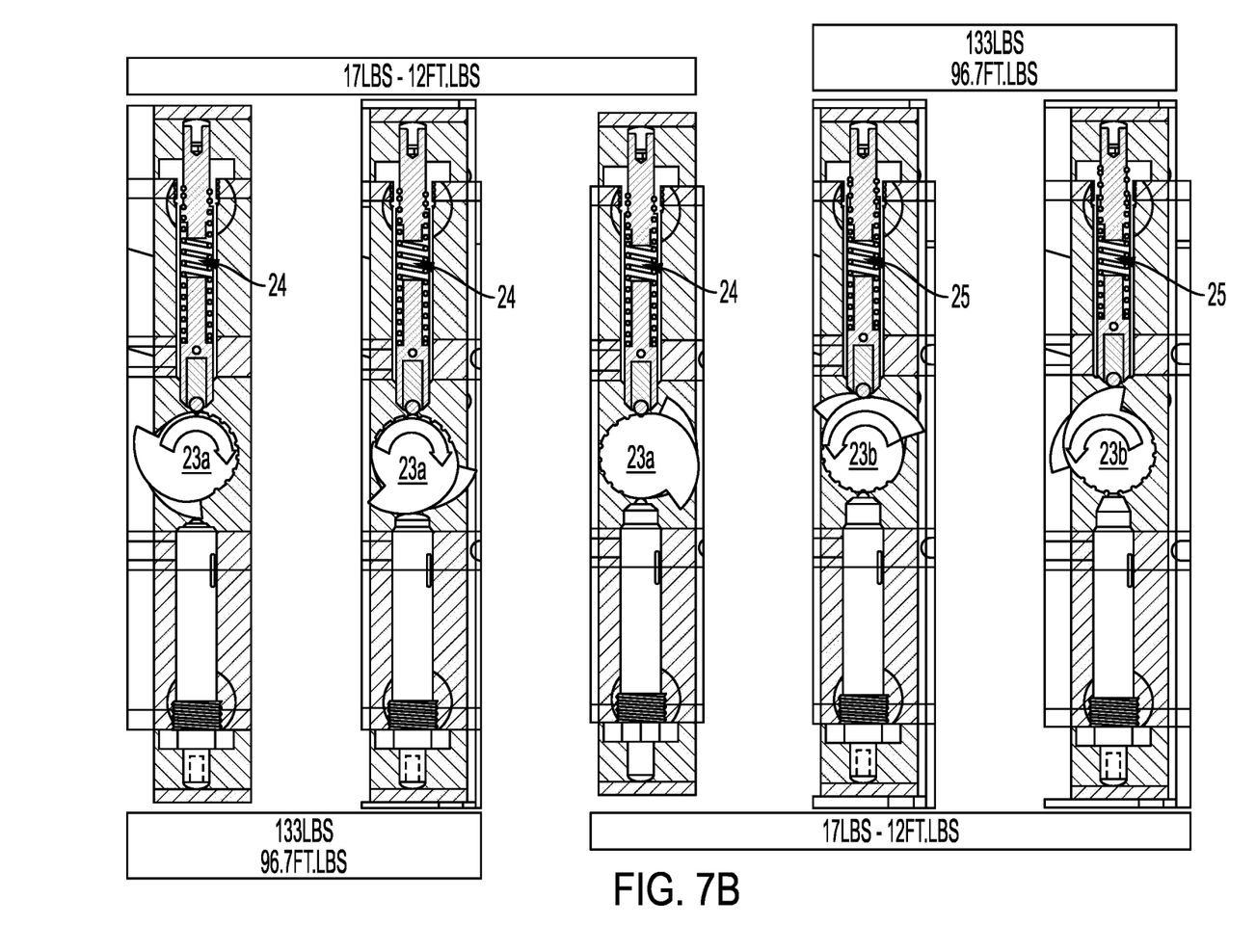
FIG. 7B includes illustrations showing cut-away front views of plungers and cams at various rotational angles.

FIG. 7A is a front view of test head manipulator arm including components like that of FIG. 2A. FIG. 7B shows side views view of the example arm of FIG. 7A illustrating different linear positions of plungers 24 and 25 at various rotational angles of cam components 23a and 23b, respectively, at varying levels of torque applied to the handle. As noted above, the tension/force on handle 30 rotates cam 23. As FIG. 7B illustrates, the load on plungers 24 and 25 varies at different angles of rotation of cam 23. Accordingly, when cam 23 has rotated to specific angle, the load on plunger 24 is different than the load on plunger 25.

While this specification describes example implementations related to "testing" and a "test system," the devices described herein may be used in any appropriate system, and are not limited to test systems or to the example test systems described herein.

Testing, including at least some control over the test head manipulator, performed as described herein may be implemented and/or controlled using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing, including control over the manipulator, can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test head manipulator comprising:
   a tower having a base and a track, the track being vertical relative to the base; and
   arms to enable support for the test head, the arms being connected to the track to move the test head vertically relative to the tower, the arms being configured to control rotation of the test head, each of the arms comprising (i) a cam that is rotatable and (ii) at least one plunger in contact with the cam and that is configured to contact the test head, where rotation of the cam is controllable to move the at least one plunger to offset an uncontrolled rotation of the test head;
   wherein the at least one plunger comprises:
   a first plunger on a first side of the cam, the first plunger comprising a first roller that contacts the cam;
   a second plunger on a second side of the cam, the second plunger comprising a second roller that contacts the cam: and
   wherein the cam is controllable to rotate relative to the first plunger and the second plunger so that, at different angles of rotation. different parts of the cam contact the first plunger and the second plunger causing movement of at least one of the first plunger or the second plunger that is transferred to the test head to offset the uncontrolled rotation.

2. The test head manipulator of claim 1, wherein cross-sections of the cam have radii that vary continuously along at least part of each cross-section.

3. The test head manipulator of claim 1, wherein each of the at first plunger and the second plunger comprises:

a ball configured to contact a part of the test head, the ball being rotatable at least in tumble and theta directions relative to an arm of the test head manipulator.

4. The test head manipulator of claim 3, wherein the at least one plunger comprises:
a housing to house the ball;
a shaft to which the housing connects; and
at least one spring that is at least partly compressible to change a longitudinal dimension of the at least one plunger.

5. The test head manipulator of claim 4, wherein the at least one plunger comprises:
a roller to contact the cam, the roller being configured to transmit displacement produced by rotation of the cam to the plunger.

6. The test head manipulator of claim 1, further comprising:
a handle, at least a part of which is external to an arm of the test head manipulator, the handle connecting mechanically to the cam, the handle being controllable to rotate the cam manually.

7. The test head manipulator of claim 1, wherein the cam is controllable to move the at least one plunger to offset a ±1.5° rotation of the test head or less.

8. The test head manipulator of claim 1, further comprising:
one or more motors to drive movement of the arms along the track.

9. The test head manipulator of claim 1, wherein the cam comprises a first angular structure and a second angular structure that are rotatable about a same axis, the first angular structure having a first radius that changes along part of the first angular structure, and the second angular structure having a second radius that changes along at least part of the second angular structure.

10. The test head manipulator of claim 9, wherein the first radius increases in a first angular direction, and the second radius that increases in a second angular direction, the first angular direction being opposite to the second angular direction.

11. The test head manipulator of claim 10, wherein at a maximum radius of the first angular structure, the first angular structure comprises a straight edge discontinuity connecting the maximum radius to a minimum radius of the first angular structure; and
wherein at a maximum radius of the second angular structure, the second angular structure comprises a straight edge discontinuity connecting the maximum radius to a minimum radius of the second angular structure.

12. A test head manipulator comprising:
a tower having a base and a track. the track being vertical relative to the base; and
arms to enable support for the test head, the arms being connected to the track to move the test head vertically relative to the tower. the arms being configured to control rotation of the test head, each of the arms comprising (i) a cam that is rotatable and (ii) two plungers in contact with the cam and configured to contact the test head, where rotation of the cam is controllable to move the two plungers to offset an uncontrolled rotation of the test head;
wherein the two plungers are oriented in opposite directions relative to the test head such that each of the two plungers is configured to contact a different part of the test head;
wherein rotation of the cam causes longitudinal movement of the two plungers, where the longitudinal movement of at least one of the two plungers is transferred to the test head to offset the uncontrolled rotation;
wherein the two plungers comprise:
a first plunger on a first side of the cam, the first plunger comprising a first roller that contacts the cam; and
a second plunger on a second side of the cam, the second plunger comprising a second roller that contacts the cam:
wherein the cam is in between the first plunger and the second plunger; and
wherein the cam is controllable to rotate relative to the first plunger and the second plunger so that, at different angles of rotation, different parts of the cam contact the first plunger and the second plunger.

13. The test head manipulator of claim 12, wherein the cam comprises a first angular structure and a second angular structure that are rotatable about a same axis, the first angular structure having a first radius that changes along part of the first angular structure, and the second angular structure having a second radius that changes along at least part of the second angular structure.

14. The test head manipulator of claim 13, wherein the first radius increases in a first angular direction, and the second radius that increases in a second angular direction, the first angular direction being opposite to the second angular direction.

15. The test head manipulator of claim 14, wherein at a maximum radius of the first angular structure, the first angular structure comprises a straight edge discontinuity connecting the maximum radius to a minimum radius of the first angular structure; and
wherein at a maximum radius of the second angular structure, the second angular structure comprises a straight edge discontinuity connecting the maximum radius to a minimum radius of the second angular structure.

16. The test head manipulator of claim 15, wherein the first angular structure and the second angular structure are each constrained to rotation that is less than 360°.

17. The test head manipulator of claim 15, wherein the first angular structure and the second angular structure are each constrained to rotation that is between 0° and 145°.

18. The test head manipulator of claim 12, wherein the first plunger and the second plunger are about 180° apart such that the first plunger is oriented towards a top of an arm of the test head manipulator and the second plunger is oriented towards a bottom of the arm.

19. A test head manipulator comprising:
a tower having a base and a track, the track being vertical relative to the base: and
arms to enable support for the test head. the arms being connected to the track to move the test head vertically relative to the tower, the arms being configured to control rotation of the test head, each of the arms comprising a cam that is rotatable and at least one plunger in contact with the cam and that is configured to contact the test head, where rotation of the cam is, controllable to move the at least one plunger to offset an uncontrolled rotation of the test head;
wherein the at least one plunger comprises a ball configured to contact a part of the test head, the ball being rotatable at least in tumble and theta directions relative to an arm of the test head manipulator; and wherein the ball is supported by multiple balls, where each of the multiple balls is rotatable relative to the ball, and where the ball is rotatable relative to each of the multiple balls.

20. The test head manipulator of claim 19, wherein there are two arms and two plungers, one plunger for each of the arms.

21. A test head manipulator for transporting a test head, comprising:
   a tower having a base and a track, the track being vertical relative to the base; and
   arms to enable support for the test head, the arms being connected to the track to move the test head vertically relative to the tower, the arms being configured to control rotation of the test head, each of the arms comprising means to offset an uncontrolled rotation of the test head;
   wherein the means to offset the uncontrolled rotation comprises;
      two plungers oriented in opposite directions, each of the plungers being configured to contact a different part of the test heat and
      a cam that is rotatable, each of the plungers being configured to contact the cam;
      wherein rotation of the cam causes longitudinal movement of the plungers that is transferred to the test head to offset the uncontrolled rotation.

22. The test head manipulator of claim 21, further comprising:
   a handle, at least a part of which is external to an arm of the test head manipulator, the handle connecting mechanically to the cam, the handle being controllable to rotate the cam manually.

* * * * *